(12) United States Patent
Yamamoto et al.

(10) Patent No.: US 7,498,083 B2
(45) Date of Patent: Mar. 3, 2009

(54) SLIDING MEMBER WITH EXCELLENT WEAR RESISTANCE IN WATER-BASED ENVIRONMENTS

(75) Inventors: Kenji Yamamoto, Kobe (JP); Atsushi Yuge, Nagasaki (JP); Toshikazu Hayashi, Nagasaki (JP)

(73) Assignees: Kabushiki Kaisha Kobe Seiko Sho, Kobe-shi (JP); Mitsubishi Heavy Industries, Ltd., Tokyo (JP)

( * ) Notice: Subject to any disclaimer, the term of this patent is extended or adjusted under 35 U.S.C. 154(b) by 209 days.

(21) Appl. No.: 11/249,266

(22) Filed: Oct. 14, 2005

(65) Prior Publication Data

US 2006/0105172 A1 May 18, 2006

(30) Foreign Application Priority Data

Nov. 12, 2004 (JP) .............................. 2004-328961

(51) Int. Cl.
*B32B 9/00* (2006.01)
(52) U.S. Cl. ...................... 428/408; 428/217; 428/336; 428/698
(58) Field of Classification Search ................. 428/336, 428/408, 217, 698; 384/912
See application file for complete search history.

(56) References Cited

U.S. PATENT DOCUMENTS

| | | | |
|---|---|---|---|
| 5,961,218 A * | 10/1999 | Nagasaka et al. ........... 384/912 |
| 6,200,675 B1 * | 3/2001 | Neerinck et al. ............ 428/336 |
| 6,740,393 B1 * | 5/2004 | Massler et al. .............. 428/408 |
| 6,821,624 B2 * | 11/2004 | Utsumi et al. ............... 428/408 |
| 6,904,935 B2 * | 6/2005 | Welty et al. ............ 137/625.17 |
| 6,994,474 B2 * | 2/2006 | Kinno et al. ................ 384/492 |
| 7,169,473 B2 * | 1/2007 | Murakami et al. .......... 428/408 |
| 7,318,847 B2 * | 1/2008 | Massler et al. ................ 51/307 |
| 2003/0099416 A1 | 5/2003 | Kinno et al. |

FOREIGN PATENT DOCUMENTS

| | | |
|---|---|---|
| EP | 0 821 077 | 1/1998 |
| EP | 1 067 211 A1 | 1/2001 |
| EP | 1 096 189 | 5/2001 |
| EP | 1 411 145 A1 | 4/2004 |
| JP | 08-233121 | 9/1996 |

(Continued)

OTHER PUBLICATIONS

H. Ronkainen, et al., "Friction and Wear properties in dry, water-and oil-lubricated DLC against alumina and DLC against steel contacts", Wear, 1998, 120-128.

(Continued)

*Primary Examiner*—Archene Turner
(74) *Attorney, Agent, or Firm*—Oblon, Spivak, McClelland, Maier & Neustadt, P.C.

(57) ABSTRACT

The present invention provides a sliding member which is a combination of sliding members to be operated in water-based environments and which has excellent wear resistance in water-based environments. An amorphous carbon film with a thickness of 0.1 to 5 μm and a hardness of 7 to 25 GPa is formed on at least one of the sliding surfaces of the sliding part of the sliding member. In a preferred mode, a hydrogenated amorphous carbon film comprising 5 to 40 at % hydrogen is formed as the aforementioned amorphous carbon film so as to achieve greater wear resistance.

6 Claims, 4 Drawing Sheets

FOREIGN PATENT DOCUMENTS

| | | | |
|---|---|---|---|
| JP | 10-184692 | | 7/1998 |
| JP | 2000-128516 | | 5/2000 |
| JP | 2003-26414 | | 1/2003 |
| JP | 2003-247060 | * | 9/2003 |
| JP | 2003-314712 | * | 11/2003 |
| JP | 2004-225762 | | 8/2004 |
| RU | 1593353 | * | 3/1997 |
| WO | 95/23878 | | 9/1995 |
| WO | 99/27893 | | 6/1999 |
| WO | 00/55385 | | 9/2000 |

OTHER PUBLICATIONS

H. Ronkainen, et al., "Tribological performance of different DLC coatings in water-lubricated conditions", Wear, 2001, pp. 267-271.

* cited by examiner

SLIDING MEMBER WITH EXCELLENT WEAR RESISTANCE IN WATER-BASED ENVIRONMENTS

BACKGROUND OF THE INVENTION

1. Field of the Invention

The present invention relates to a sliding member, and particularly to a sliding member which exhibits excellent wear resistance when operated in a water-based environment.

2. Description of the Related Art

Currently the drive force for industrial machines is mainly provided by oil hydraulics, but considering the environmental contamination and sanitary problems in the food industry due to runoff of working media (oil-based media), it is undesirable in some cases to use oil-based media as the working media. Using oil-based media in a garbage incinerator causes back flash. In recent years there has been research into replacing oil-based working media with water-based media, which are relatively harmless and non-flammable.

However, the following problems occur when working media are converted from oil-based media to water-based media. That is, because water-based media do not have the same lubricating effects as oil-based media, seizure may occur in sliding parts when water-based media are used in the operations of conventional industrial machines. The use of ceramics and engineering plastics as materials for sliding members has been proposed in order to prevent seizure, but this has not been practical because these materials are expensive in comparison with metal materials and have less workability or impact resistant than metal material.

Covering the base material constituting the sliding member with a hard coat has been proposed as a means of resolving above problems of using water-based media. For example, in Japanese Patent Application Laid-open No. H10-184692, it is proposed that using a metal material as the base material, a titanium nitride film be formed on the sliding surface of one member, while either the other member is made of a non-brittle material, or else a nitride ceramic, oxide ceramic or carbide ceramic is formed as a hard coat on the sliding surface of the other member. Even by forming the hard film described in Japanese Patent Application Laid-open No. H10-184692, however, it is difficult to further raise the lubricity and wear resistance in water-based environments so that seizure of the sliding member can be reliably prevented.

Moreover, in the case that high-pressure water is supplied inside machinery such as hydraulic pumps for example, because the contact pressure of the sliding member becomes same level as the water pressure, resistance to high surface pressure (adhesion between base material and coat) and low friction properties under high surface pressure are required, but conventional sliding members do not meet these requirements.

In Japanese Patent Application Laid-open No. 2003-26414, it is proposed that an amorphous hydrogen-free carbon film or a hydrogen-containing carbon film comprising a fixed amount of hydrogen be formed on a base material in order to achieve excellent wear resistance and strong adhesion with the base material in machine parts and the like. However, the coat disclosed here has a wide range of hardness values, i.e. Vickers hardness 10 to 100 GPa, and wear and damage are likely to occur quickly if the hardness of the coat is not controlled more strictly when coating a sliding member to be used in water-based environments. In Japanese Patent Application Laid-open No. 2000-128516, an amorphous carbon film having low-wear properties and excellent adhesiveness as a piston ring coat or the like is disclosed, but since this coat has a wide range of hardness values, i.e. Hv 2000 to 10000 (20 to 100 GPa given that HV 1000=10 GPa) in the high range, it is unlikely to reliably provide wear resistance of a sliding member to be used in water-based environments.

SUMMARY OF THE INVENTION

In light of these circumstances, it is an object of the present invention to improve the wear resistance of a sliding member to be operated in water-based environments, and specifically to further reduce the friction coefficient and wear quantity of the sliding member while at the same time ensuring excellent resistance to high surface pressure.

The sliding member of the present invention is a combination of sliding members to be operated in water-based environments, with an amorphous carbon film with a hardness of 7 to 25 GPa and a thickness of 0.1 to 5 μm being formed on at least one of the sliding surfaces of the sliding part of the sliding member.

A hydrogenated amorphous carbon film comprising 5 to 40 at % (atomic %) hydrogen is preferably formed as the aforementioned amorphous carbon film because it exhibits better wear resistance. Moreover, the aforementioned amorphous carbon film is preferably formed on both sliding surfaces of the aforementioned sliding part because better wear resistance is achieved thereby.

The aforementioned "water-based environment" signifies either a state immersed in a water-based solvent which does not exhibit equivalent lubricating effects to oil-based solvents, such as pure water, tap water, an aqueous emulsion or the like, or a state in which such a water-based solvent is supplied as a lubricant.

According to the present invention, even if the sliding member is operated in a water-based environment such as that of a hydraulic pump or the like, seizure and wear of the sliding part is controlled, so that an industrial machine comprising a sliding member can be driven continuously for a long time.

BRIEF DESCRIPTION OF THE DRAWINGS

Further objects and advantages of the present invention will become clear from the following description taken in conjunction with the preferred embodiments thereof with reference to the accompanying drawings, in which.

DESCRIPTION OF THE PREFERRED EMBODIMENTS

The inventors studied coats for covering the sliding parts of sliding members with the aim of further reducing the friction coefficient and wear quantity of the sliding part of a sliding member which is operated in a water-based environment while improving resistance to seizure under high surface pressure. As a result, they reached the present invention upon discovering that it was sufficient to form a 0.1 to 5 μm amorphous carbon (diamond-like carbon, sometimes abbreviated hereunder as "DLC") film with a hardness of 7 to 25 GPa on at least one sliding surface of the aforementioned sliding part.

The aforementioned DLC is a carbon which has a structure in which diamond and graphite structures are mixed, and in addition to being called amorphous carbon as mentioned above it is sometimes called non-crystalline carbon, i-carbon, diamond-like carbon or the like. As described below, films comprising hydrogen and having C—H hydrocarbon bonds are also included in DLC films as long as these are specified as "hydrogenated amorphous carbon film".

The reason that the present invention is limited to coatings for covering sliding parts of sliding members is described below.

First, in the present invention, a DLC film is formed as described above on the surface of a sliding member to be operated in a water-based environment. This is because the DLC film can more efficiently enhance wear resistance in a water-based environment than another metal film, metal compound film or inorganic compound film. The mechanism by which friction and wear are reduced in this way by the formation of the DLC film is thought to be as follows. The surface of the DLC film is altered by surface pressure and heat generated during sliding, forming a soft transfer layer on the counterpart, so that even when this counterpart undergoes friction it has a low friction coefficient because of the shear generated in the transfer layer and also because the transfer layer acts as a protective film for the counterpart. It is also thought that friction is low because the DLC is carbonized (graphitized) during sliding in a water-based environment and water in the environment is adsorbed by the graphite.

After grasping these advantages of DLC film, the inventors discovered as the result of further research that wear resistance in water-based environments could be further improved and that specifically reductions in the friction coefficient and wear quantity could be reliably achieved even in water-based environments if the DLC film were formed with a hardness in a specific range. That is, a DLC film with a hardness of 7 GPa or more is formed in the present invention. If hardness is too low, the DLC film rapidly wears without achieving the sufficient wear resistance of the DLC film itself, which allows the base materials to contact with one another, causing seizure. Preferably the GPa of the DLC film is 10 or more.

However, if the DLC film is too hard, although the DLC film itself will be less liable to wear, the sliding surface of the other sliding member which is its counterpart will be more liable to wear (this property is sometimes referred to hereunder as "counterpart attack"). In the past DLC films have been used as coating films in many cases, but these films have been very hard with hardness values of HV 3000 to 4000 (or 30 to 40 GPa given HV 1000=10 GPa). Since significant wear of the sliding counterpart occurs when such a hard coat is formed only on one surface of a sliding member, the sliding member cannot be operated satisfactorily for a long time. In the present invention, the hardness of the coated DLC film is 25 GPa or less, or preferably 20 GPa or less.

The aforementioned hardness of the DLC film was measured with a nanoindenter. Specifically, the loading-unloading curve was measured at each of five points under maximum loads of 2, 5, 7, 10 and 20 mN using a Berkovich pyramidal indenter, and hardness was calculated. In calculating hardness, indenter shape was corrected for using the methods described in Phil. Mag. 74 (1996), 1097, A. Shimamoto et al.

One method of controlling the hardness of the DLC film within the specified range as described above is to adjust the bias voltage when depositing a film with a UBMS (unbalanced magnetron sputtering) device or the like. In the method, high bias voltage causes the hardness to increase. Hardness can also be controlled by adjusting the hydrogen content of the DLC film. High hydrogen content causes the hardness to reduce.

The thickness of the aforementioned DLC film must be controlled in the present invention. If the film is too thin, the DLC film will be lost through initial wear in the breaking-in process during initial use, exposing the base material and making it liable to seizure. Therefore, the thickness of the aforementioned DLC film is 0.1 μm or more, or preferably 0.5 μm or more. A thicker DLC film is better from the standpoint of reducing the friction coefficient and wear quantity and increasing surface pressure at seizure, but if the film is too thick, the coat will be liable to peeling on the edge in particular due to the internal stress of the DLC film. Therefore, the film thickness is specified as 5 μm or less in the present invention, or preferably 3 μm or less.

If a hydrogenated amorphous carbon film containing a fixed amount of hydrogen is formed as the aforementioned DLC film, the wear quantity and friction coefficient can be more reduced than a DLC film containing no hydrogen. The reasons for this are not necessarily clear in detail, but it is thought that when C—H bonds are present on the outermost surface of a DLC coat, the surface energy is different than it is when the outermost coat consists solely of carbon, with the result that water is adsorbed more easily.

The amount of hydrogen in the DLC film overall is preferably 5 at % or more in order to achieve these effects. Since the sliding properties of a DLC film differ depending on the sliding environment, it is important to select the optimal amount of hydrogen according to the sliding environment. The wear quantity and friction coefficient can be sufficiently reduced with a hydrogenated amorphous carbon film in which hydrogen constitutes 25 at % or more of the DLC film. However, wear resistance is actually reduced if the hydrogenated amorphous carbon film is formed with too much hydrogen, so the amount of hydrogen in the DLC film overall is 40 at % or less.

In addition to consisting of carbon alone or of carbon and hydrogen as described above, the DLC film of the present invention may also comprise 10 at % or less of a total of Si, Cr and other added elements as third elements.

In the present invention, it is desirable that the aforementioned DLC film be formed on both sliding surfaces of the sliding part because the wear quantity and friction coefficient of the sliding member are dramatically reduced and resistance to high surface pressure is greatly improved thereby. It is thought that the wear quantity and friction coefficient of the sliding member can be greatly reduced by forming DLC films on both sliding surfaces of the sliding part because the aforementioned transfer layer is much more easily formed and more strongly bound to the DLC film surface of the counterpart.

The sliding member of the present invention has the aforementioned DLC film formed on at least one sliding surface of the sliding part, and in a preferred mode has the DLC film formed on both sliding surfaces of the sliding part, but is not otherwise limited. Consequently, in addition to the aforementioned mode in which the DLC film is formed only on the sliding part it may have a mode in which the DLC film is also formed at sites other than the sliding part.

When the DLC film is formed at multiple locations (for example, when the DLC film is formed on both sliding surfaces of the sliding part or when the DLC film is formed on multiple sliding parts), the films do not necessarily have to be of the same type as long as they fulfill the respective conditions specified in the present invention, and they may differ from one other in hardness, thickness and hydrogen content within the aforementioned specified ranges.

The method of forming the aforementioned DLC film (deposition method) is not particularly specified, but because the amount of hydrogen in the coat is difficult to control in the case of the CVD method of deposition using a hydrocarbon gas as the raw material, the arc method or sputtering method using a solid carbon source is recommended. Film deposition by sputtering is particularly recommended. In the arc method, arc discharge of the carbon evaporation source is accompanied by a scattering of numerous particles which may detract from the wear resistance properties if they adhere to the coat; while in the sputtering method, almost no particles are generated, and the amount of hydrogen in the coat can be controlled at will by including a hydrocarbon gas such as methane or ethylene in the process.

The amount of hydrogen in the DLC film is largely determined by the amount of hydrocarbon gas, but even given the same total amount of hydrogen in the hydrocarbon gas it is easier to increase the hydrogen content of the DLC film using a gas (such as methane gas or ethylene gas) which contains many hydrogen atoms per molecule. The amount of hydrogen in the DLC film is also dependent on the bias voltage during film deposition, and as a general rule raising the bias voltage will tend to decrease the hydrogen content of the DLC film given the same amount of methane. The hydrogen content of the DLC film can be kept within the aforementioned range if these conditions are controlled during film deposition. Bias voltage can be controlled in either the sputtering method or arc method for purposes of controlling the hardness of the DLC film.

A metal coat or inorganic metal compound coat can be formed as an intermediate layer between the DLC film and base material of the present invention to the extent that the wear resistance and the like of the sliding member are not adversely affected. For example a coat consisting of Si, Ti, Zr, Cr, W or Mo alone or of an oxide, nitride, carbide or the like of these can be formed to a thickness of about 0.1 to 1 μm. The method of forming this intermediate layer is not restricted and a sputtering or arc method similar to that used for the aforementioned DLC layer is recommended.

There are no particular limits on the base material of the sliding member of the present invention, and for example a cemented carbide, stainless steel, alloy tool steel, high speed steel or other iron alloy, titanium alloy, aluminum alloy or copper alloy, glass, alumina or other ceramic or resin or other base material can be used. Moreover, the sliding member of the present invention is a combination of sliding members to be operated in water-based environments, and specific examples include hydraulic pistons, hydraulic cylinders, valve plates and others which undergo relative movement.

The present invention is explained in more detail below using examples. However, the present invention is not limited by the following examples, but can be accomplished with the addition of suitable changes, which are all included within the technical scope of the present invention to the extent that they conform to what is stated above and below.

EXAMPLES

Figure 1:
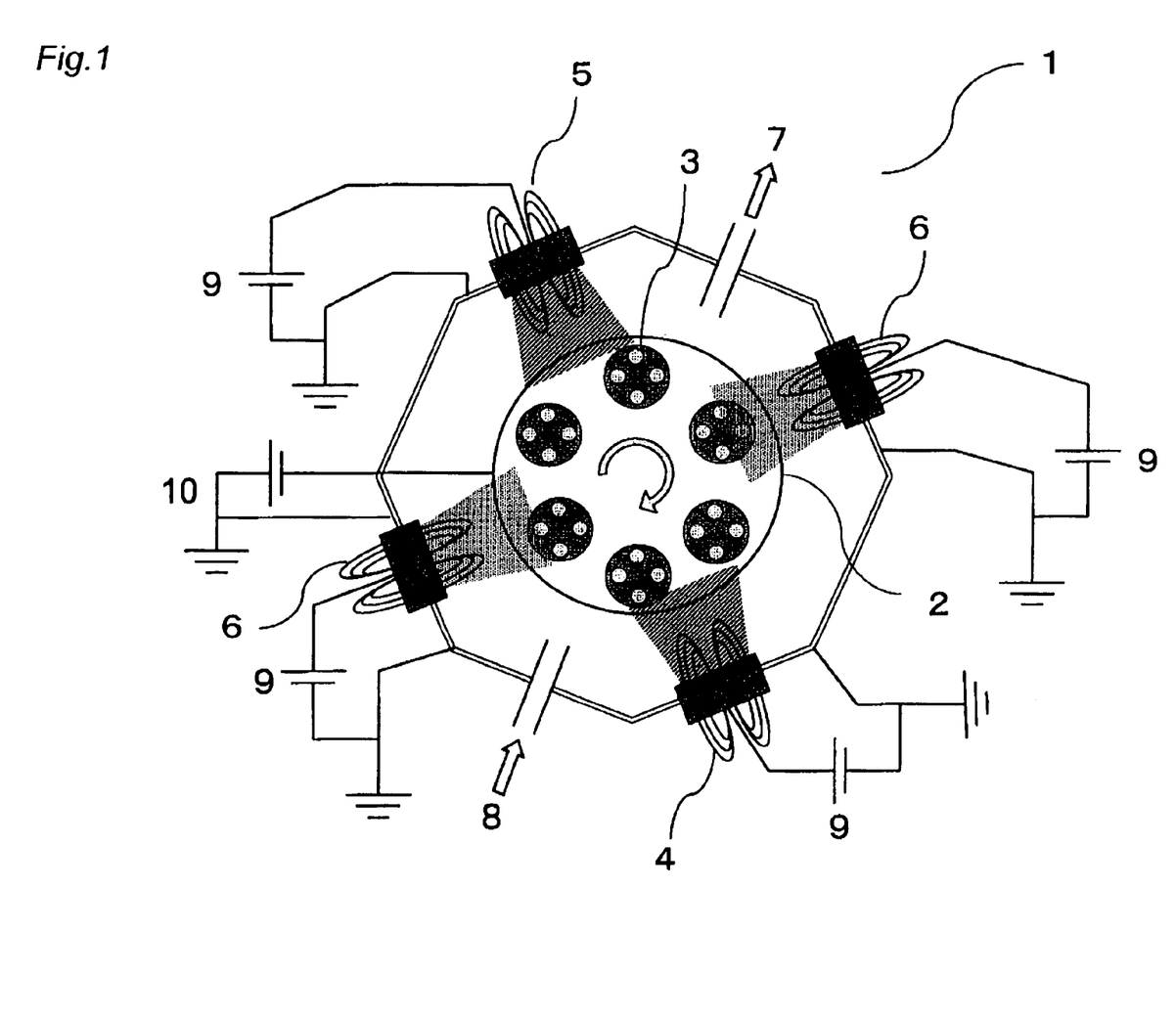
FIG. 1 is a schematic top view of a film deposition device used in the examples.

A DLC film was formed using the unbalanced magnetron sputtering device 1 having multiple evaporation sources shown in FIG. 1. This sputtering device 1 was equipped with 4 evaporation sources 4 through 6, and Cr evaporation source 4, W evaporation source 5 and two C evaporation sources 6 were used in forming the intermediate layer described below and the DLC film.

As the base material, a (mirror polished) cemented carbide plate was used for purposes of measuring hardness and hydrogen content, while the test piece described below was used for the ball-on-disc sliding test and the ring-on-disc seizure load evaluation test. For purposes of film deposition, the aforementioned base material was first ultrasound washed in etha-nol, then set on a base material stage 2 inside the sputtering device 1, which was exhausted to a vacuum of $1\times10^{-3}$ Pa or less, after which base material 3 was heated to about 300° C. to degas base material 3. Next, the base material was maintained at a temperature of about 200° C. while being cleaned with Ar ions.

The intermediate layer was then formed, followed by the DLC layer. In this test, as shown in Tables 1 and 2, either Cr/Cr-C/DLC film layered coat
(a layered coat consisting of a Cr film, Cr carbide film and DLC film formed in that order to a base material) or Cr/W/W-C/DLC film layered coat
(a layered coat consisting of a Cr film, W film, W carbide film and DLC film formed in that order on a base material) was formed.

The Cr layer or W layer which was the aforementioned intermediate layer was formed by sputtering using a Cr target or W target in a pure Ar atmosphere. The Cr carbide layer or W carbide layer was formed by gradually decreasing the power input to the Cr target or W target while increasing the power input to the carbon target in an Ar—$CH_4$ atmosphere (5%). The intermediate layer was 0.5 to 1 μm thick in all cases.

The aforementioned DLC film was formed with an input power to the target of 2.5 kW using an Ar or Ar+$CH_4$ mixed gas under a total pressure of 0.6 Pa. The substrate bias was applied in a range of 0 to 150 V so that the substrate (object to be treated) would have minus potential relative to the earth potential. The thickness of the DLC film was 1 to 2 μm except as specified in Tables 1 and 2. An untreated test piece having no intermediate layer or DLC film was also prepared as a comparative sample.

The test pieces with formed intermediate layers and DLC films and the untreated test piece were evaluated as follows.

The coat hardness was measured with a nanoindenter. The hardness of the DLC film alone was measured here. The hydrogen content of the DLC film was measured by ERDA (Elastic Recoil Detection Analysis), and the amount of hydrogen as a percentage of the carbon and hydrogen constituting the DLC film (at %) was calculated.

To evaluate wear resistance, a ball-on-disc sliding test was performed under the following conditions, and the friction coefficient, relative ball wear quantity and relative disc wear quantity were measured. The results are shown in Table 1. As indicated in Table 1, the relative ball wear quantity and relative disc wear quantity values show the measured values multiplied by 109.

Ball-On-Disc Test:

Discs; SUS630 (heat treatment H900, hardness HV400) coated with various DLC films or not coated.

Size; ϕ55 mm×5 mm thick, mirror polished on one side

Balls; ⅜ inch uncoated SUS630 (heat treatment H900, hardness HV400)

Sliding speed; 0.5 m/s

Vertical load; 2N

Figure 2:
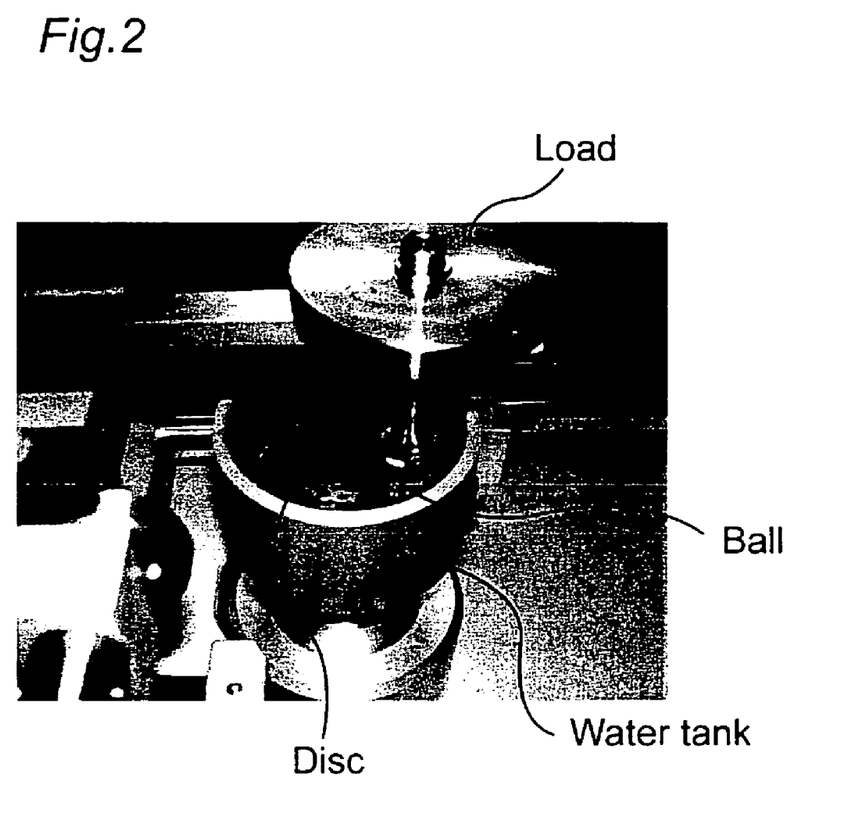
FIG. 2 is a photograph showing a ball-on-disc sliding test.

Lubrication; Distilled water (with disc immersed as shown in FIG. 2)

Sliding distance; 5000 m

TABLE 1

| Test No. | Coat | Disc side | | | | Ring side Coat | Friction coefficient | Relative disc wear amount (mm³/N · m)(×10⁹) | Relative ball wear amount (mm³/N · m)(×10⁹) |
| | | Methane (vol %) | Bias voltage (V) | Hardness (GPa) | Hydrogen (at %) | | | | |
|---|---|---|---|---|---|---|---|---|---|
| 1 | None | — | — | — | — | None | 0.5 | 8.99 × 10⁴ | 5.88 × 10³ |
| 2 | Cr/Cr-C/DLC | 10 | 0 | 5 | 30 | None | 0.08 | 610.2 | 8.918 |
| 3 | Cr/Cr-C/DLC | 10 | 50 | 7 | 29 | None | 0.1 | 82.47 | 2.641 |
| 4 | Cr/Cr-C/DLC | 10 | 75 | 11 | 29 | None | 0.11 | 53.5 | 25.3 |
| 5 | Cr/Cr-C/DLC | 10 | 100 | 15 | 27 | None | 0.12 | 32.99 | 64.44 |
| 6 | Cr/W/W-C/DLC | 10 | 150 | 21 | 25 | None | 0.15 | 35.73 | 75.4 |
| 7 | Cr/W/W-C/DLC | 10 | 250 | 30 | 23 | None | 0.17 | 32.7 | 157 |
| 8 | Cr/W/W-C/DLC | 0 | 100 | 12 | 2.5 | None | 0.16 | 29.7 | 74.6 |
| 9 | Cr/W/W-C/DLC | 10 | 100 | 15 | 27 | None | 0.12 | 32.99 | 84.44 |
| 10 | Cr/W/W-C/DLC | 20 | 100 | 13.5 | 35 | None | 0.13 | 35.7 | 73.5 |
| 11 | Cr/W/W-C/DLC | 30 | 100 | 6 | 43 | None | 0.14 | 857 | 8.78 |
| 12 | DLC | 10 | 100 | 15 | 27 | None | | Could not evaluate due to peeling | |
| 13 | Cr/Cr-C/DLC* | 10 | 150 | 15.0 | 30.0 | None | 0.1-0.5 | Substrate exposed immediately after start of test | |
| 14 | Cr/Cr-C/DLC* | 10 | 150 | 15.0 | 30.0 | None | 0.13 | 34.54 | 65.2 |
| 15 | Cr/Cr-C/DLC* | 10 | 150 | 15.0 | 30.0 | None | 0.13 | 37.56 | 63.2 |

*No. 13: DLC thickness 0.05 μm, No. 14: DLC thickness 0.2 μm, No. 15: DLC thickness 4.5 μm The following can be deduced from Table 1. Because coats according to the present invention were formed in Nos. 3 to 6, 9, 10, 14 and 15, the friction coefficients are low and wear quantity of both the disc and ball is controlled. By contrast, because the conditions of the present invention are not met in Nos. 1, 2, 7 and 13, the friction coefficients are higher and wear quantities of the disc and ball are remarkable. That is, because in No. 1 no DLC film is formed while in No. 2 the DLC film is not hard enough, there is considerable wear quantity especially of the disc in the wear test. Because the DLC film is too hard in No. 7, the DLC film exhibited counterpart attack, and there is considerable wear quantity especially of the ball in the wear test. In No. 13, the base material was exposed immediately after the start of the test because the DLC film was too thin.

In Nos. 8 and 11, the amount of hydrogen in the DLC coat was outside the recommended range, and these examples show that increases in friction coefficient and wear quantity can be reliably controlled if the hydrogen content of the DLC film is also controlled.

In No. 12 the DLC film was coated directly on the base material without the aforementioned intermediate layer, and in this case the friction coefficient and wear quantity could not be measured due to peeling in the wear test.

Next, to evaluate resistance to high surface pressure (resistance to seizure under high surface pressure conditions), a ring-on-disc seizure load evaluation test was performed under the following conditions using samples in which either the ring or the disc or both had been coated with a DLC film as shown in Table 2, and the friction coefficients, seizure loads and disc wear quantities were measured. The results are shown together in Table 2.

Figure 3:
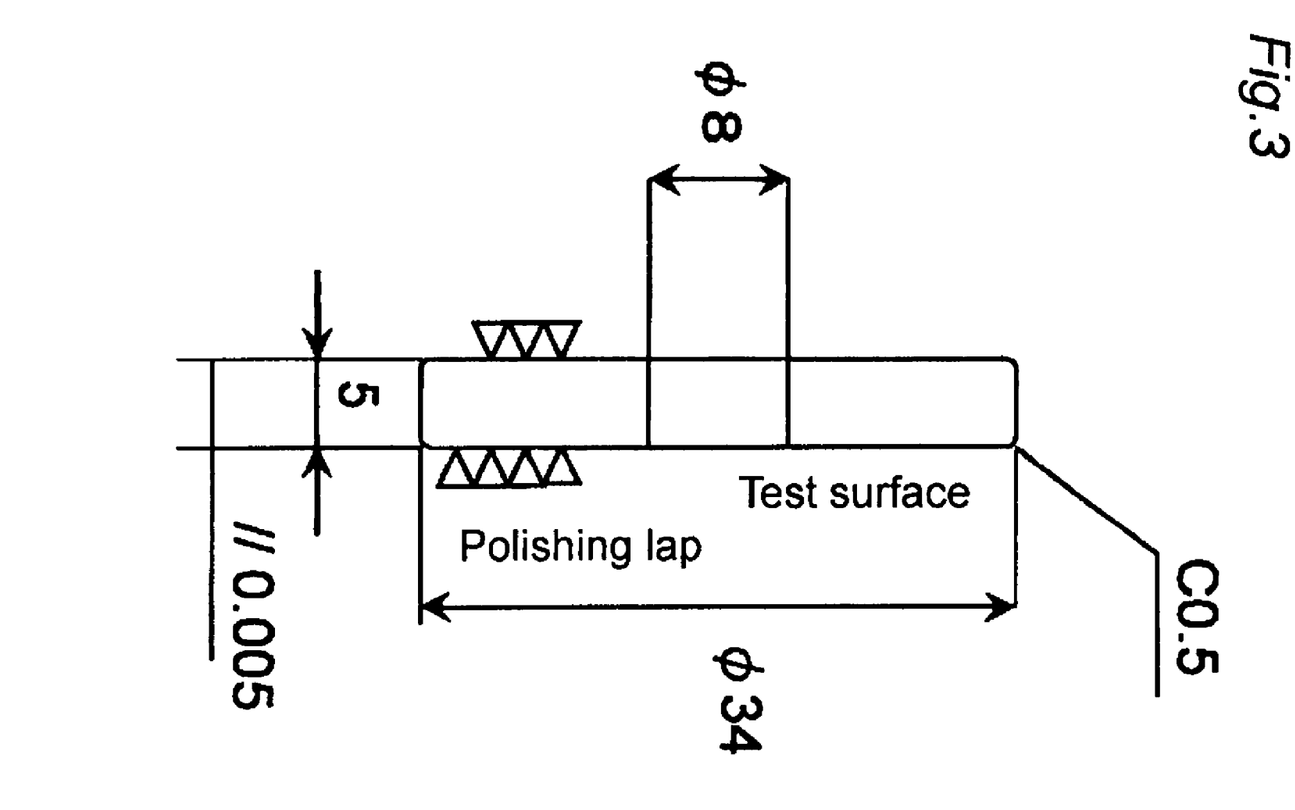
FIG. 3 shows the shape of a disc used in the examples.
Figure 4A:
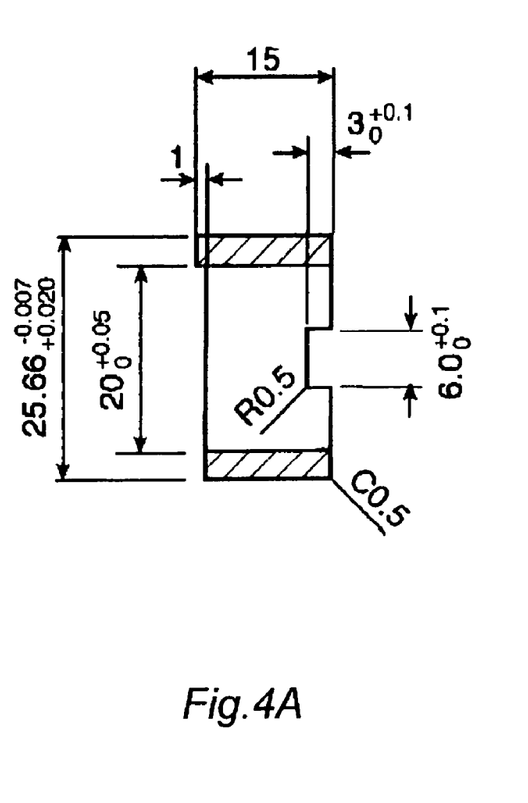
FIG. 4 shows the shape of the ring used in the examples.
Figures 4B, 4C:
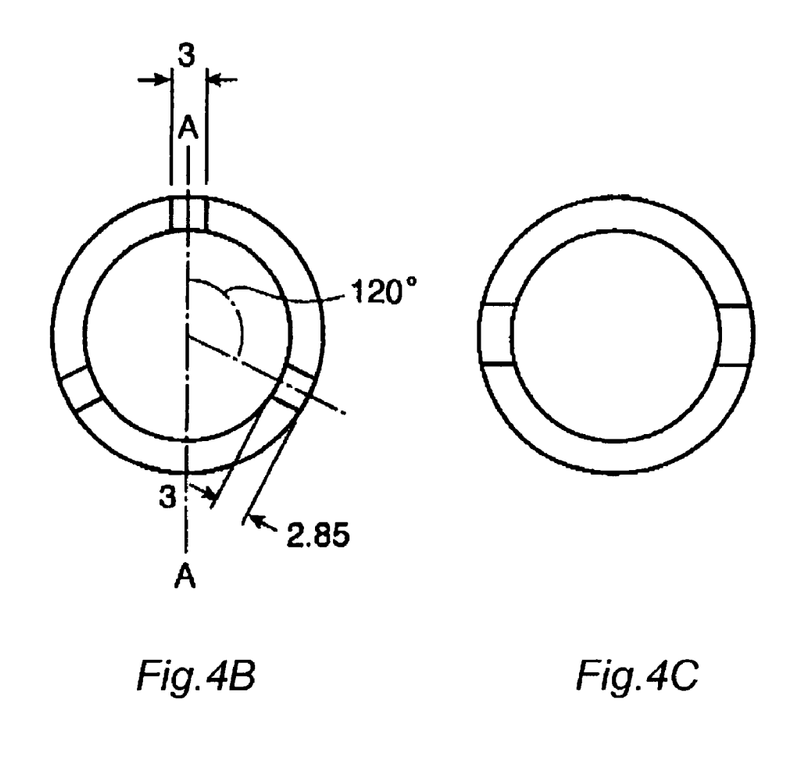

Ring-On-Disc Seizure Load Evaluation Test:
Discs; SUS630 coated with various DLC films or uncoated (heat treatment H900, hardness HV400).
Size; φ34 mm×5 mm thick, mirror polished on one side (side view shown in FIG. 3).
Rings; SUS630 coated with various DLC films or uncoated (heat treatment H900, hardness HV400). Size: inner diameter 20 m, outer diameter 25 mm, contact area 25.65 mm3 (side view and cross-section shown in FIG. 4).
Contact area; 25.65 mm
Sliding speed; 1.0 m/s
Vertical load; 50 to 900 N, increased in steps (surface pressure conversion 1.95 to 35 MPa)
Lubrication; Distilled water (disc immersed as in FIG. 2 above)
Sliding distance; 500 m for each load

TABLE 2

| Test No. | Ring side | | | | | Disc side | |
| | Coat | Methane (vol %) | Bias voltage (V) | Hardness (GPa) | Hydrogen (at %) | Coat | Methane (vol %) |
|---|---|---|---|---|---|---|---|
| 1 | None | — | — | — | — | None | — |
| 2 | Cr/Cr-C/DLC | 10 | 0 | 5 | 30 | None | — |
| 3 | None | — | — | — | — | Cr/Cr-C/DLC | 10 |
| 4 | Cr/Cr-C/DLC | 10 | 0 | 5 | 30 | Cr/Cr-C/DLC | 10 |
| 5 | Cr/Cr-C/DLC | 10 | 100 | 15 | 27 | None | — |
| 6 | None | — | — | — | — | Cr/Cr-C/DLC | 10 |
| 7 | Cr/Cr-C/DLC | 10 | 100 | 15 | 27 | Cr/Cr-C/DLC | 10 |
| 8 | Cr/Cr-C/DLC | 10 | 150 | 21 | 25 | None | — |
| 9 | None | — | — | — | — | Cr/W/W-C/DLC | 10 |
| 10 | Cr/W/W-C/DLC | 10 | 150 | 21 | 25 | Cr/W/W-C/DLC | 10 |
| 11 | Cr/W/W-C/DLC | 10 | 250 | 30 | 23 | None | — |
| 12 | None | — | — | — | — | Cr/W/W-C/DLC | 10 |
| 13 | Cr/W/W-C/DLC | 10 | 250 | 30 | 23 | Cr/W/W-C/DLC | 10 |

TABLE 2-continued

| | | | | | | | | |
|---|---|---|---|---|---|---|---|---|
| 14 | Cr/W/W-C/DLC | 10 | 100 | 15 | 27 | Cr/W/W-C/DLC | 10 |
| 15 | Cr/W/W-C/DLC | 10 | 100 | 15 | 27 | Cr/W/W-C/DLC | 10 |
| 16 | Cr/W/W-C/DLC | 10 | 150 | 21 | 25 | Cr/W/W-C/DLC | 10 |
| 17 | DLC | 10 | 150 | 21 | 25 | DLC | 10 |
| 18 | Cr/Cr-C/DLC* | 10 | 100 | 15 | 27 | Cr/Cr-C/DLC* | 10 |
| 19 | Cr/Cr-C/DLC* | 10 | 100 | 15 | 27 | Cr/Cr-C/DLC* | 10 |
| 20 | Cr/Cr-C/DLC* | 10 | 100 | 15 | 27 | Cr/Cr-C/DLC* | 10 |

| | Disc side | | | Surface pressure | | |
|---|---|---|---|---|---|---|
| Test No. | Bias voltage (V) | Hardness (GPa) | Hydrogen (at %) | at seizure (MPa) | Friction coefficient | Disc wear area ($\mu m^3$) |
| 1 | — | — | — | 0.5 | 0.45 | Seized, could not measure |
| 2 | — | — | — | 1.89 | 0.15 | Seized, could not measure |
| 3 | 0 | 5 | 30 | 3.8 | 0.15 | Seized, could not measure |
| 4 | 0 | 5 | 30 | 31 | 0.12 | $1.56 \times 10^7$ |
| 5 | — | — | — | 27 | 0.09 | Seized, could not measure |
| 6 | 100 | 15 | 27 | 20 | 0.08 | Seized, could not measure |
| 7 | 100 | 15 | 27 | >35 | 0.03 | $2.61 \times 10^6$ |
| 8 | — | — | — | 12 | 0.06 | Seized, could not measure |
| 9 | 150 | 21 | 25 | 24 | 0.12 | Seized, could not measure |
| 10 | 150 | 21 | 25 | >35 | 0.04 | $7.29 \times 10^6$ |
| 11 | — | — | — | 10 | 0.16 | Seized, could not measure |
| 12 | 250 | 30 | 23 | 14 | 0.12 | Seized, could not measure |
| 13 | 250 | 30 | 23 | 25 | 0.08 | $9.35 \times 10^6$ |
| 14 | 0 | 5 | 30 | >35 | 0.04 | $4.56 \times 10^6$ |
| 15 | 150 | 21 | 25 | >35 | 0.05 | $3.87 \times 10^6$ |
| 16 | 0 | 5 | 30 | 31 | 0.12 | $9.80 \times 10^6$ |
| 17 | 150 | 21 | 25 | Could not evaluate due to peeling | | |
| 18 | 100 | 15 | 27 | 5 | 0.39 | Seized, could not measure |
| 19 | 100 | 15 | 27 | 30 | 0.08 | $3.50 \times 10^6$ |
| 20 | 100 | 15 | 27 | >31 | 0.05 | $2.34 \times 10^6$ |

*No. 18: DLC thickness 0.05 μm, No. 19: DLC thickness 0.2 μm, No. 20: DLC thickness 4.5 μm The following can be deduced from Table 2. Because Nos. 5, 6, 8, 9, 14, 16, 19 and 20 have a DLC film stipulated by the present invention coated on at least one of the ring and disc, resistance to surface pressure is high, with high surface pressures at seizure, and the friction coefficients are also low. Because a DLC film stipulated the present invention is coated on both the ring and disc in Nos. 7, 10 and 15, the surface pressures at seizure at high, the friction coefficients are very low and wear quantity of the disc is controlled.

In contrast, when neither the ring nor the disc was coated with a DLC film stipulated by the present invention, either the surface pressure at seizure was much lower so that the disc wear area could not be measured due to seizure, or the disc wear area was extremely large. The friction coefficient values were also high. That is, these problems occurred in No. 1 because there was no DLC film and in Nos. 2 through 4 because both the rings and discs were coated with DLC films of very low hardness. The same problems occurred in Nos. 11 and 12 because either the ring or disc was coated with a DLC film of very low hardness while the other was coated with a very hard DLC film, and in No. 13 because both the ring and disc were coated with very hard DLC films.

In No. 17 the DLC film was coated directly on the base material without the aforementioned intermediate layer, and in this case the surface pressure at seizure, friction coefficient and disc wear area could not be measured due to peeling during the wear test.

In No. 18 the surface pressure at seizure was very low because the DLC film was so thin, and the disc wear area could not be measured due to seizure.

What is claimed is:

1. A sliding member with excellent wear resistance in water-based environments, comprising a combination of sliding members to be operated in water-based environments, wherein both sliding surfaces of said sliding part consist essentially of
    an amorphous carbon film and
    an intermediate layer between the amorphous carbon film and a base material, wherein
    the amorphous carbon film is a hydrogenated amorphous carbon film consisting of carbon and hydrogen,
    an atomic per cent of hydrogen is from 5 to 40 at %,
    a thickness of the amorphous carbon film is from 0.5 to 5 μm,
    a hardness of the amorphous carbon film is 7 to 25 GPa;
    the intermediate layer consists of:
        a layered coat of a Cr film on the base material,
        a W film on the Cr film,
        a W-C film on the W film, and
    a water-based environment is a state of immersion in a water-based solvent which does not exhibit equivalent lubricating effects to oil-based solvents or a state wherein a water-based solvent is supplied as a lubricant.

2. The sliding member according to claim 1, wherein the thickness of the amorphous carbon film is 0.5 to 3.0 μm.

3. The sliding member according to claim 1, wherein hardness of the amorphous carbon film is 7 to 20 GPa.

4. A sliding member with excellent wear resistance in water-based environments, comprising a combination of sliding members to be operated in water-based environments, wherein both sliding surfaces of said sliding part consist essentially of
    an amorphous carbon film, wherein
    the amorphous carbon film is a hydrogenated amorphous carbon film consisting of carbon and hydrogen,
    an atomic per cent of hydrogen is from 5 to 40 at %, a thickness of the amorphous carbon film is from 0.5 to 5 µm, a hardness of the amorphous carbon film is 7 to 25 GPa, and a water-based environment is a state of immersion in a water-based solvent which does not exhibit equivalent lubricating effects to oil-based solvents or a state wherein a water-based solvent is supplied as a lubricant.

5. The sliding member according to claim 4, wherein the thickness of the amorphous carbon film is 0.5 to 3.0 µm.

6. The sliding member according to claim 4, wherein the hardness of the amorphous carbon film is 7 to 20 GPa.

* * * * *